United States Patent
Bhalla et al.

(10) Patent No.: US 7,378,884 B2
(45) Date of Patent: May 27, 2008

(54) MOSFET FOR SYNCHRONOUS RECTIFICATION

(75) Inventors: Anup Bhalla, Santa Clara, CA (US); Sik K. Lui, Sunnyvale, CA (US)

(73) Assignee: Alpha & Omega Semiconductor, Ltd., Hamilton (BM)

(*) Notice: Subject to any disclaimer, the term of this patent is extended or adjusted under 35 U.S.C. 154(b) by 0 days.

(21) Appl. No.: 11/804,877

(22) Filed: May 21, 2007

(65) Prior Publication Data
US 2007/0221972 A1 Sep. 27, 2007

Related U.S. Application Data

(62) Division of application No. 11/083,470, filed on Mar. 18, 2005, now Pat. No. 7,221,195.

(51) Int. Cl.
*H03B 1/00* (2006.01)
(52) U.S. Cl. ...................... 327/110; 327/566
(58) Field of Classification Search ............... 327/110, 327/423, 424, 427, 564, 565, 566, 588
See application file for complete search history.

(56) References Cited

U.S. PATENT DOCUMENTS 6,344,768 B1 * 2/2002 Daun-Lindberg et al. ... 327/424
7,116,153 B2 * 10/2006 Pai .............................. 327/430

* cited by examiner

*Primary Examiner*—Jeffrey S Zweizig
(74) *Attorney, Agent, or Firm*—Bo-In Lin

(57) ABSTRACT

This invention discloses a new MOSFET device. The MOSFET device has an improved operation characteristic achieved by connecting a shunt FET of low impedance to the MOSFET device. The shunt FET is to shunt a transient current therethrough. The shunt FET is employed for preventing an inadvertent turning on of the MOSFET device. The inadvertent turning on of the MOSFET may occur when a large voltage transient occurs at the drain of the MOSFET device. By connecting the gate of the shunt FET to the drain of the MOSFET device, a low impedance path is provided at the right point of time during the circuit operation to shunt the current without requiring any external circuitry.

3 Claims, 9 Drawing Sheets

MOSFET FOR SYNCHRONOUS RECTIFICATION

The Patent Application is a Divisional Patent Application of patent application Ser. No. 11/083,470 filed on Mar. 18, 2005 and then issued into a U.S. Pat. No. 7,221,195 by the same inventors of this Patent Application.

BACKGROUND OF THE INVENTION

1. Field of the Invention

The invention disclosed herein relates generally to the circuit configuration and packaging configuration of power MOSFETs. More particularly, this invention relates to a novel and improved circuit diagram for preventing shoot through problem by using a shunt FET and different configurations for integrating the shunt FET.

2. Description of the Prior Art

Conventional power MOSFET devices still face the shoot through problems that result in excessive dissipation and efficiency loss. Referring to FIG. 1 for a circuit diagram of a conventional buck converter 10 that includes a high side MOSFET 15 and a low side MOSFET 20 serially connected between an input terminal 25 having an input voltage represented by Vin and a ground terminal 30. The drain of the low side MOSFET 20 is connected to the source of the high side MOSFET 15 at a mid point 35 connecting to the load 40 through inductance L and capacitance C. When the buck converter 10 operates at high speed, a shoot through condition becomes a problem when both the high side and low side MOSFET are turned on at the same time causing a shoot through current to flow between the input terminal 25 and the ground terminal 30. The shoot through condition results in excessive dissipation and efficiency loss. In order to avoid the shoot through problem, a controlling circuit 45 is implemented to control the gate signals to generate a dead time between the gate signals for the high side and low side MOSFET. FIG. 2 shows such a dead time between the time when the high side MOSFET 15 is turned off and the time when the low side MOSFET 20 is turned on such that the high side and low side MOSFETs are prevented from turning on simultaneously.

However, the shoot through problem cannot be completely avoided due to the fact that a large drain current is generated at the low side MOSFET 20 when the high side MOSFET 15 is turned on as shown in FIG. 3 due to a large rate of change of the voltage, i.e., dV/dt, at the mid-connection point 35. FIG. 4 shows an equivalent circuit of the buck converter wherein the drain current generated flows through the gate-drain capacitor Cgd and then to the ground through the internal gate-source capacitor Cgs or through an equivalent circuit segment comprises gate resistor Rg inductor Lg, and external gate drive resistance Rext. Under such circumstances, if the impedance from the gate to the ground is not below a certain value then the drain current, i.e., Cdg*dV/dt, will generate a voltage drop across the gate of the low side MOSFET that would be large enough to turn on the low side MOSFET 20 thus inducing shoot-through. In modern circuit designs, a designer typically controls the problem by using a large gate-source capacitance Cgs or a low Crss/Ciss ratio. Alternately, the problem may also be prevented by providing a low gate resistance and using a high current gate drive with low Rext. However, if the gate drive circuitry, i.e., the control circuit 45, is remote from the MOSFET, the inductance Lg may become quite large. This causes the current path connected with Rg, Rext, and Lg to have great impedance thus leaving only the Cgs path to sink the transient current. The only way to suppress the shoot through current is by increasing the capacitance Cgs to reduce the impedance. However, this solution will lead to excessive gate charge losses in the low side MOSFET 20. For the above reasons, a person of ordinary skill of the art is faced with limitations and difficulties in designing a converter to effectively prevent the shoot through problem.

Therefore, a need still exists in the art to provide an improved device configuration and manufacturing methods to make MOSFET devices with a very low impedance path for the Cdg*dV/dt current. The low impedance suppresses the gate-source voltage spike, and thus prevents shoot-through problems and resolve the above discussed difficulties as now encountered in the prior art.

SUMMARY OF THE PRESENT INVENTION

It is therefore an object of the present invention to provide an improved MOSFET device by connecting a shunt FET of low impedance to the MOSFET device. The shunt FET is to shunt a transient current therethrough. The shunt FET is employed for preventing an inadvertent turning on of the MOSFET device. The inadvertent turning on of the MOSFET may occur when a large voltage transient occurs at the drain of the MOSFET device. By connecting the gate of the shunt FET to the drain of the MOSFET device, a low impedance path is provided at the right point of time during the circuit operation to shunt the current without requiring any external circuitry.

Specifically, it is an object of the present invention to provide an improved MOSFET device with a shunt FET connected to the MOSFET device. The shunt FET can either be fully integrated with the MOSFET device by building the MOSFET device and the shunt FET on a same semiconductor substrate. Alternately, the shunt FET and the MOSFET device may be formed as a two-die or multi-die package where the shunt FET is connected to the MOSFET device either by bond-wires or by implementing a flip-chip configuration.

Briefly in a preferred embodiment this invention discloses a metal oxide semiconductor field effect transistor (MOSFET) device. The MOSFET device further includes a shunt FET connected between a gate and a source of the MOSFET device wherein the shunt FET is provided to shunt a transient drain-to-gate current to the source of the MOSFET device while maintaining a low voltage across the FET hereby preventing the MOSFET device from turning on. In a preferred embodiment, the shunt FET has a drain-to-source on-resistance substantially between 0.01 to 2 ohms for maintaining the low voltage across the FET. In another preferred embodiment, a gate voltage of the shunt FET is controlled for turning on to shunt the transient gate-to-drain current of the MOSFET device. In another preferred embodiment, a gate of the shunt FET is connected to a drain of the MOSFET device for turning on to shunt the transient gate-to-drain current of the MOSFET device. In another preferred embodiment, the shunt FET is integrated with the MOSFET device as a single integrated circuit (IC) supported on a same substrate. In another preferred embodiment, the shunt FET is disposed in a layer of polysilicon formed on a top surface of the substrate with a region in the substrate next to a body region of said MOSFET device connected to the drain of the MOSFET device under the polysilicon layer functioning as a gate of the shunt FET. In another preferred embodiment, the shunt FET is disposed in a layer of re-crystallized silicon formed on a top surface of the substrate with a region in the substrate next to a body region of said MOSFET device connected the drain of the MOSFET device under the re-crystallized silicon functioning as a gate of the shunt FET. In another preferred embodiment, the shunt FET is a bidirectional blocking shunt FET integrated with the MOSFET device as a single integrated circuit (IC) supported on a same substrate. In another preferred embodiment, the shunt FET is integrated with the MOSFET device as a single integrated circuit (IC) in a same substrate wherein the shunt FET is disposed in a junction isolation region in the substrate. In another preferred embodiment, the shunt FET is provided as a separate die. In another preferred embodiment, the shunt FET is provided as a separate die and connected to the MOSFET device with conductive wires. In another preferred embodiment, the shunt FET is provided as a separate die and connected to the MOSFET device as a flip chip.

This invention further discloses a method for manufacturing a power MOSFET device by method for shunting a transient current of a metal oxide semiconductor field effect transistor (MOSFET) device. The method further includes a step of connecting a shunt FET between a gate and a source of the MOSFET device to shunt a transient gate-to-drain current of the MOSFET device while maintaining a low voltage across the FET whereby preventing the MOSFET device from turning on. In a preferred embodiment, the step of maintaining a low voltage across the FET further includes a step of providing a drain-to-source resistance substantially between 0.01 to 2 ohms for the shunt FET to maintain the low voltage across the FET. In another preferred embodiment, the step of a shunting the transient current further includes a step of controlling a gate voltage of the shunt FET for turning on to shunt the transient gate-to-drain current of the MOSFET device. In another preferred embodiment, the method further includes a step of integrating the shunt FET with the MOSFET device as a single integrated circuit (IC) supported on a same substrate. In another preferred embodiment, the method further includes a step of packaging the shunt FET with the MOSFET device as a two-die package by connecting the shunt FET to the MOSFET device through bond-wires. In another preferred embodiment, the method further includes a step of packaging the shunt FET with the MOSFET device as a two-die package by connecting the shunt FET as a flip-chip to the MOSFET device.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1:
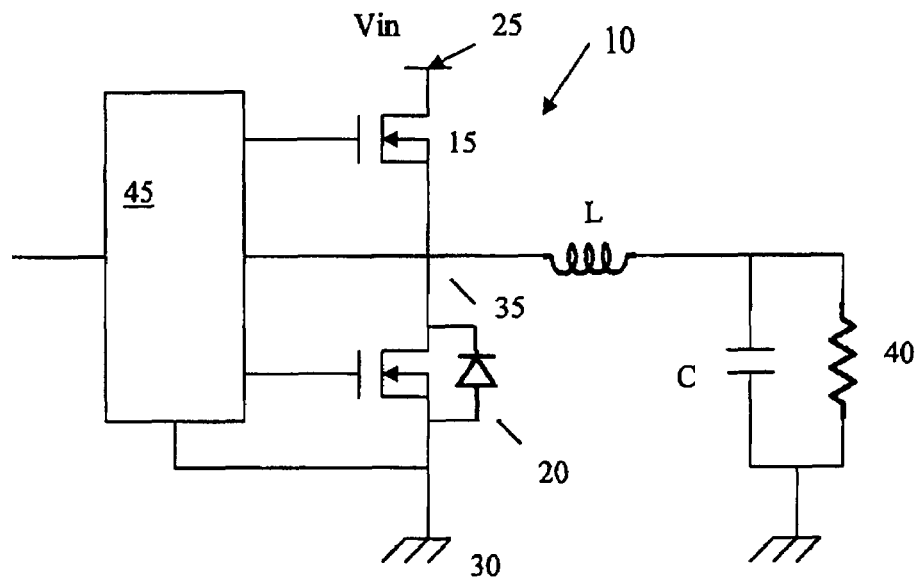
FIG. 1 is a circuit diagram of a conventional buck converter.
Figure 2:
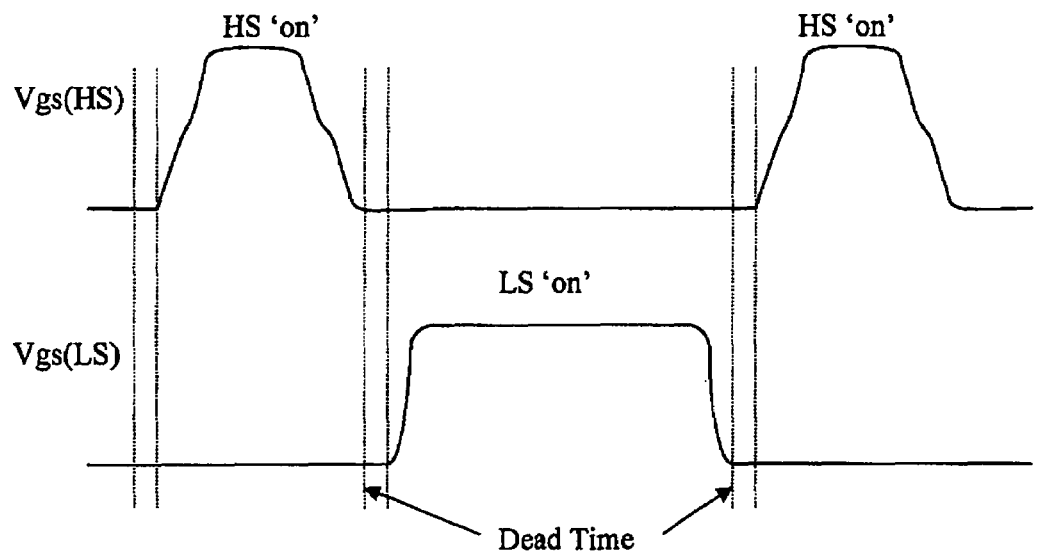
FIG. 2 shows the waveforms of gate voltages for the high side and low side MOSFET of FIG. 1.
Figure 3:
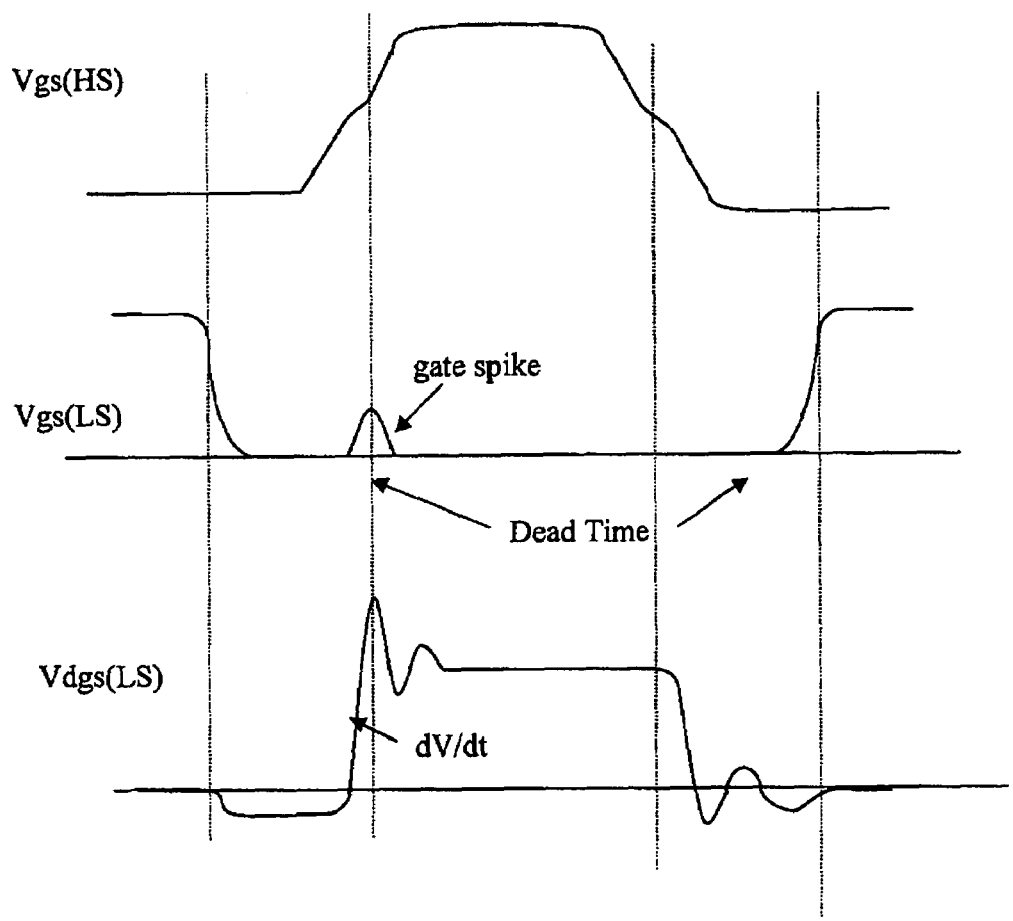
FIG. 3 shows the gate spike and drain to source voltage Vds of the low side MOSFET resulting from a high rate of change of the drain (Vds) voltage of high side MOSFET.
Figure 4:
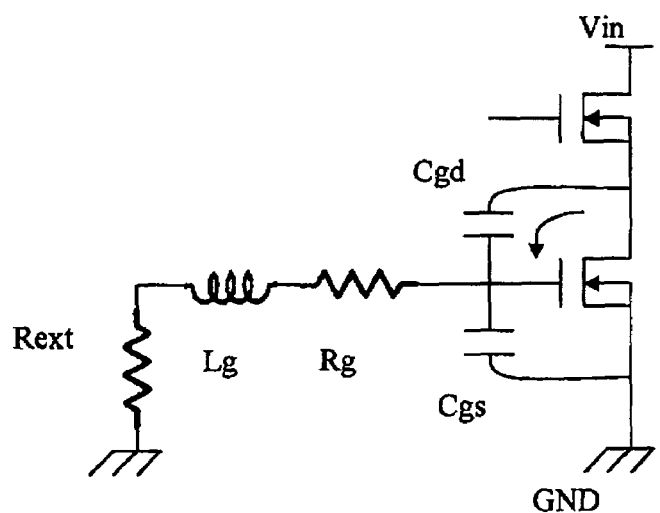
FIG. 4 shows a conventional circuit in attempt to resolve the shoot through problem as that shown in FIG. 3.
Figure 5A:
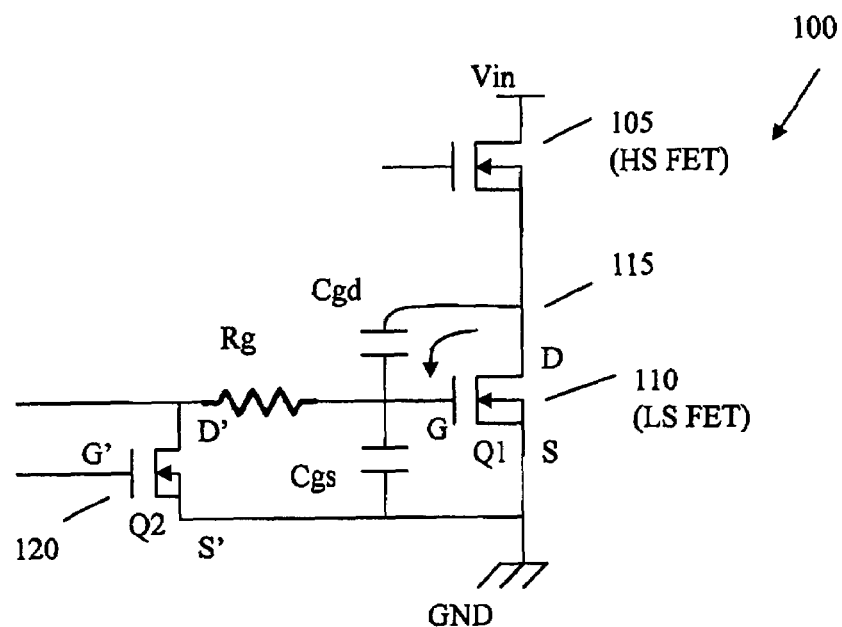
FIG. 5A is a circuit diagram of a buck converter of this invention provided with a shunt FET for the low side MOSFET.
Figure 5B:
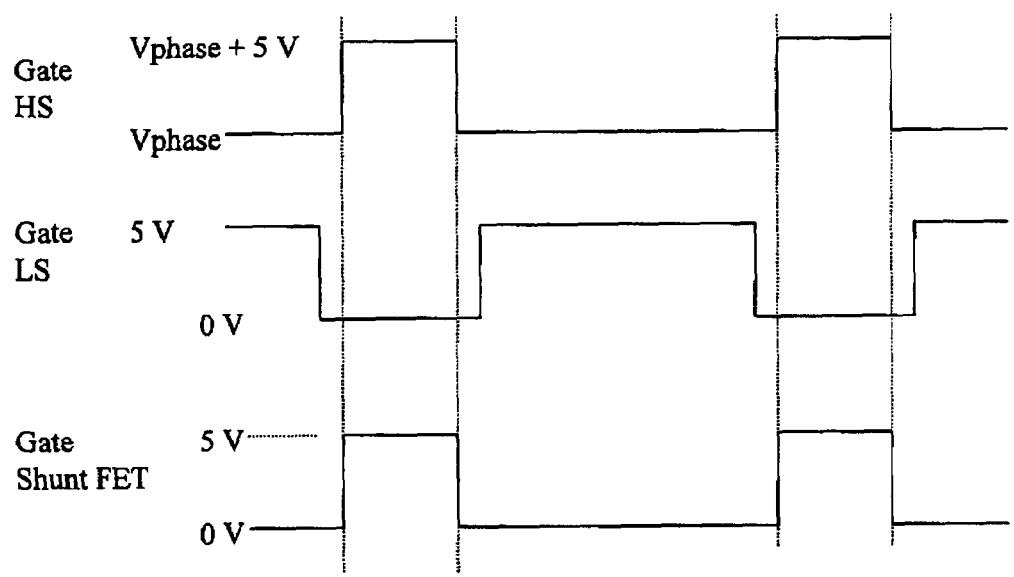
FIG. 5B shows the waveforms of the time variations of the gate voltages for the high side, low side and shunt FETs for the buck converter shown in FIG. 5A.

Referring to FIG. 5 for a new circuit diagram of a buck converter 100 of this invention. Similar to a conventional buck converter 10, the buck converter 100 includes a high side MOSFET 105 and a low side MOSFET 110 with the source of the high side MOSFET 105 connected to the drain of the low side MOSFET 110 at a mid-connection point 115. A shunt FET 120, i.e., Q2, is connected between the gate and the source of the low side MOSFET 110, i.e., Q1. The shunt FET 120 is provided with low resistance, e.g., 0.01 to 2 ohms. The gate of the shunt MOSFET 120 is separately controlled to stay on while the voltage transition occurs on the drain of the low side MOSFET 110. The transient current that flows through the gate-drain capacitor Cgd is shunted to the ground via the shunt MOSFET 120. The voltage across the shunt FET 120 is kept low by minimizing the drain to source resistance Rds and the inductance Lds thus prevents the voltage drop at the gate from ever rising above the threshold voltage Vth and turning the low side MOSFET 110 on. From FIG. 5B, it is clearly shown that the signal that is required to activate the shunt FET 120 is substantially synchronized with the timing of the signals required to activate the high side MOSFET 105 with the difference that the gate signal of the shunt FET 120 is referenced to the source of the low side MOSFET 110. Therefore, the signals that are provided to the gate for activating the shunt FET 120 may be derived by simply passing the pulse width modulation (PWM) input signal to the gate of the shunt MOSFET 105 through a buffer to create a sufficient delay to match the timing of the high side MOSFET gate signal.

Figure 6:
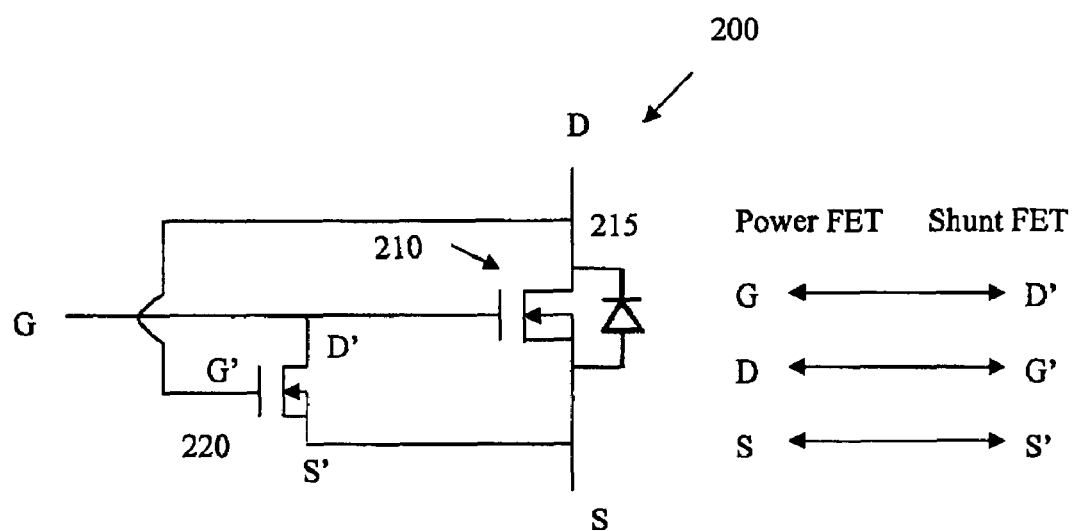
FIG. 6 shows an alternate embodiment with the gate of the shunt FET connected to the drain of the low side MOSFET.

FIG. 6 shows a buck converter 200 that has substantially a similar structure as the buck converter 100 shown in FIG. 5A. The gate of the shunt FET 220 is connected to the drain 215 of the low side MOSFET 210. With this configuration, a composite device that is formed as a standard MOSFET with three terminals, i.e., D, S and G as shown, external to the MOSFET package. This configuration requires a shunt FET with a Vgsmax rating greater than the peak voltage at the drain node. This can be achieved by using a sufficiently thick gate oxide for a voltage up to 50 volts. By implementing a buck converter as shown, no extra signals are required to activate the shunt FET 220 and the composite device is still a 3 terminal part with the same external connections as a standard low side MOSFET (making it a drop in replacement).

Figure 7A:
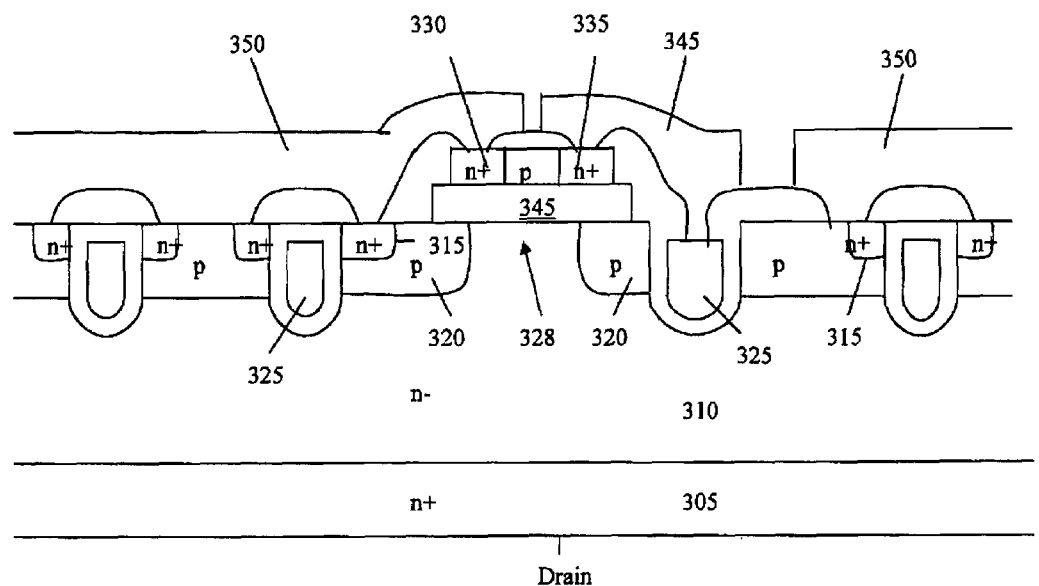
FIGS. 7A and 7B are a side cross sectional view and a top view respectively of an actual implementation of a composite MOSFET device of FIG. 6.
Figure 7B:
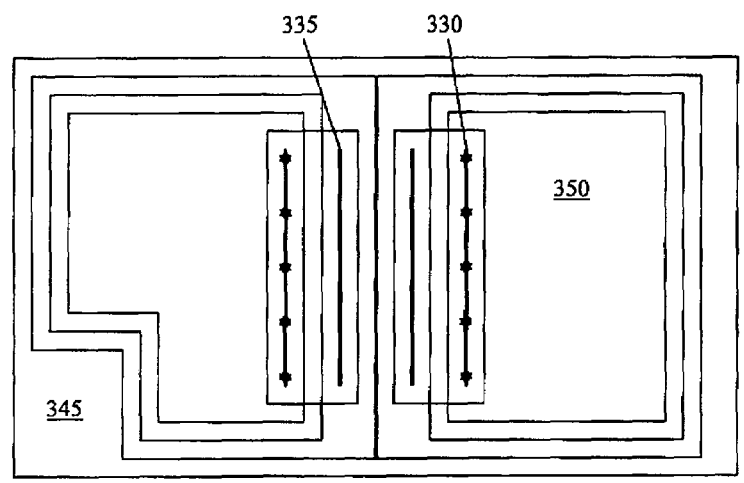

FIGS. 7A and 7B are side cross sectional view and top view of an actual implementation of the circuit configurations as a fully integrated power MOSFET with a shunt FET. The power MOSFET 300 is formed on a N+ substrate 305 functioning as a drain. The N+ substrate supporting a N– epi-layer 310 thereon to form a vertical pn-junction region with a N+ source region 315 formed on top of a deeper p-body region 320. The power MOSFET 300 further includes a gate 325 formed with polysilicon layer deposited in a trench formed in the epi-layer 310. A current path is established from the source 315 via a channel formed in the p-body 320 along the gate 325 and extends to the drain in the N+ substrate 305.

A shunt FET is formed with the gate of the shunt FET 328 connected to the drain 305 of the power MOSFET, a source node S' 330 and a drain node D' 335 of the shunt FET is placed on a piece of polysilicon 340 or re-crystallized silicon on insulator. The dielectric layer 342 has a sufficient thickness to withstand the peak voltage Vds between the drain and the source asserted to the power MOSFET. Selective epitaxial techniques may be applied to the formation of this silicon layer 342. If this device is placed internal to the power MOSFET as shown in FIG. 7B, connecting the drain and the source of the shunt FET between gate and source of the power FET is straightforward using the same metal layer used to form the gate pad 345 and source pads 350 in a conventional MOSFET process. This is an elegantly low inductance method of forming the composite device. The width of the body region 320 spaced under the polysilicon layer 342 is kept sufficiently small to prevent a premature breakdown in the power MOSFET. Referring to FIG. 7B, polysilicon FET body contacts to S' at one end or periodically. A contact to the gate polysilicon along the center of the gate bus is not required if there this no trench feeders extended to the active area from the gate bus. The gate contact may be limited to the outer periphery and the gate metal transmits the gate voltage to these locations.

Figure 8A:
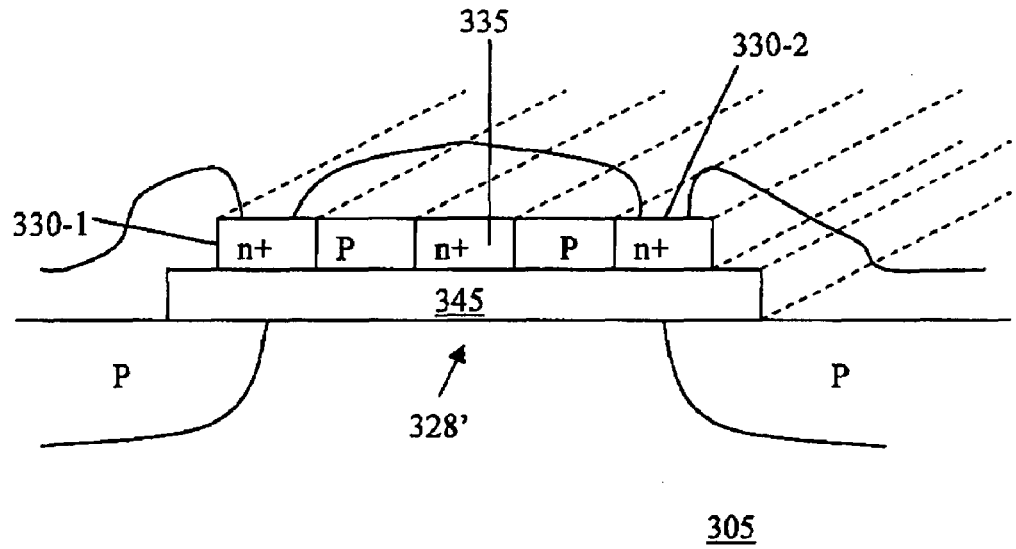
FIGS. 8A and 8B are a side cross sectional view and a circuit diagram respectively of a back-to-back shunt FET implemented a MOSFET with bi-directional blocking at the gate of the power MOSFET.
Figure 8B:
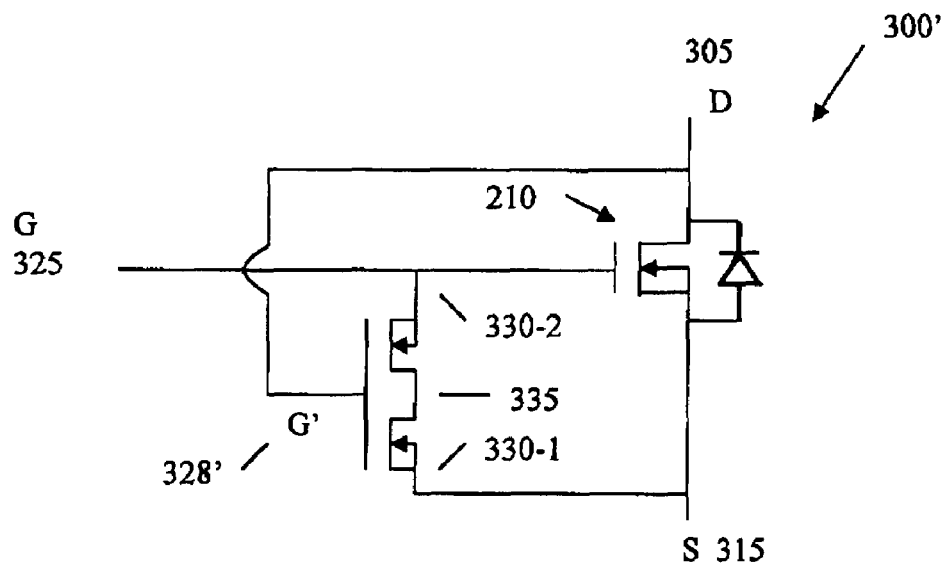

FIGS. 8A and 8B show an alternate preferred embodiment with a back-to-back shunt FET with a common gate 328' for implementing a structure for providing a bi-directional blocking at the gate 325 of the power FET. The Vdsmax rating of the shunt FET must exceed the required Vgsmax rating of the power FET. The Vgsmax rating of the shunt FET must exceed the Vdsmax of the power FET as before. The net on-resistance of the back-to-back shunt FETs must still be low enough to handle the Crss*dV/dt current with minimal voltage spike at the gate.

The key problem with integrating the shunt FETs in Polysilicon is the poor channel mobility and high leakage current in Polysilicon MOSFETs compared to their Silicon counterparts. This means that a larger channel width is needed in a Polysilicon MOSFET to achieve the same Rdson as in a Silicon MOSFET. Since the off-state leakage current for the Polysilicon MOSFET is higher than that of a Silicon MOSFET, the larger channel width means that the net leakage can become quite high. This appears as a gate-to-source leakage in the composite device, and therefore needs to be minimized. Using recrystallized Silicon or SOI wafers to build the shunt FET resolves this problem. The problem may also be resolved by using known techniques to increasing the grain size of the Poly, and passivating the grain boundaries, both of which improve the Rdson and lower the leakage current.

Figure 9:
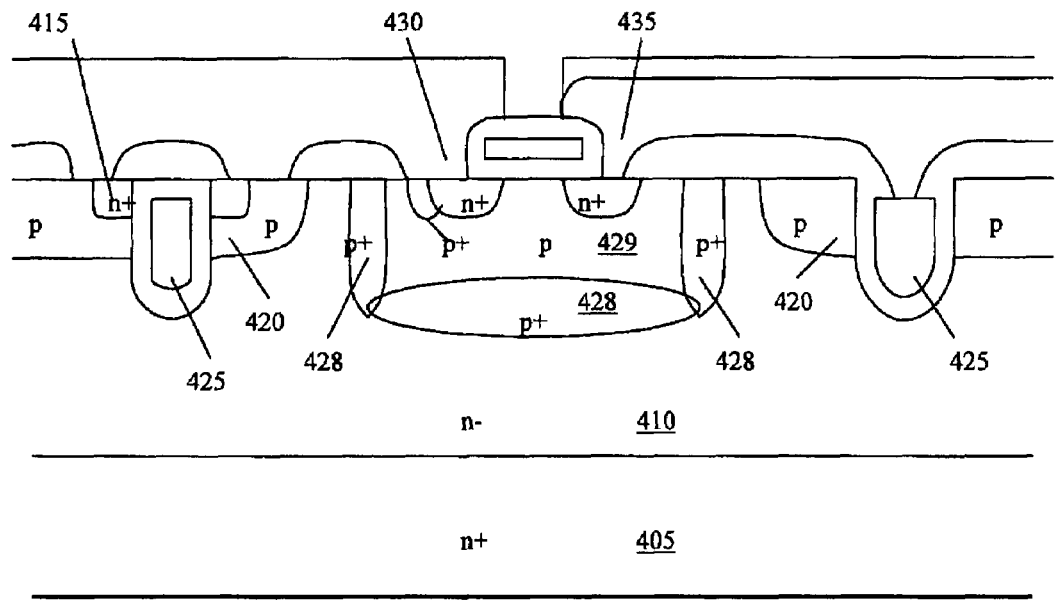
FIG. 9 shows a side cross sectional view of a power MOSFET integrating the shunt FET using a junction isolation configuration.

FIG. 9 is a cross sectional view of a power MOSFET integrated with a shunt FET implemented with another approach by using the standard junction isolation techniques. The power MOSFET 400 is formed on a N+ substrate 405 functioning as a drain. The N+ substrate supporting a N– epi-layer 410 thereon to form a vertical pn-junction region with an N+ source region 415 formed on top of a deeper p-body region 420. The power MOSFET 400 further includes a gate 425 formed with polysilicon layer deposited in a trench formed in the epi-layer 410. A current path is established from the source 415 via a channel formed in the p-body 420 along the gate 425 and extends to the drain in the N+ substrate 405.

A shunt FET is formed on an isolation tub 429 formed in the epitaxial layer 410 surrounded by isolation junction regions 428. The isolation tub 429 surrounded by the junction isolation regions 428 is to prevent accidental turn-on of the parasitic transistors. Of course, one may implement different configurations by using more complex oxide isolation, but that would be cost prohibitive. The shunt FET is formed with a source 430 connected to a power FET source terminal 445, a drain 435 connected to the power FET gate 425. The gate 440 of the shunt FET can either be provided as a user controlled terminal, or shorted to the power FET Drain.

Figure 10:
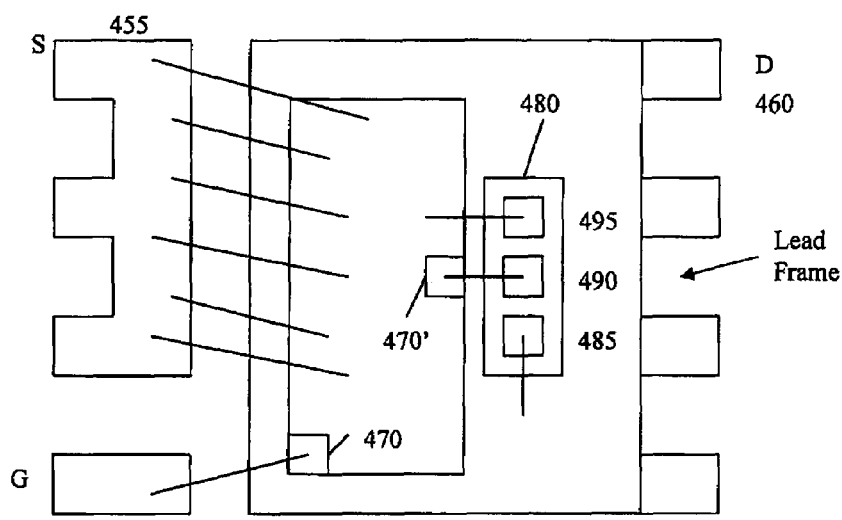
FIG. 10 shows a co-packaged FET with a shunt FET.

In addition to the above embodiment, a two-die in one package configuration may also be implemented in case there is technological difficulty in integrating the device as described above. FIG. 10 shows a specially constructed two-die package with a standard power FET 450 with a common-drain shunt FET 480 connected in the same package. In this case, while the drain of the power FET 460 is connected to the die pad of the package, the shunt FET 480 is attached using a non-conductive die attachment. It is then bond-wired as shown in FIG. 10 to the power FET with the gate 485 of the shunt FET connected to the drain 460 of the power FET. The power FET has been provided with a second gate pad 470' to receive the connection from the drain 490 of the shunt FET 480.

Figure 11:
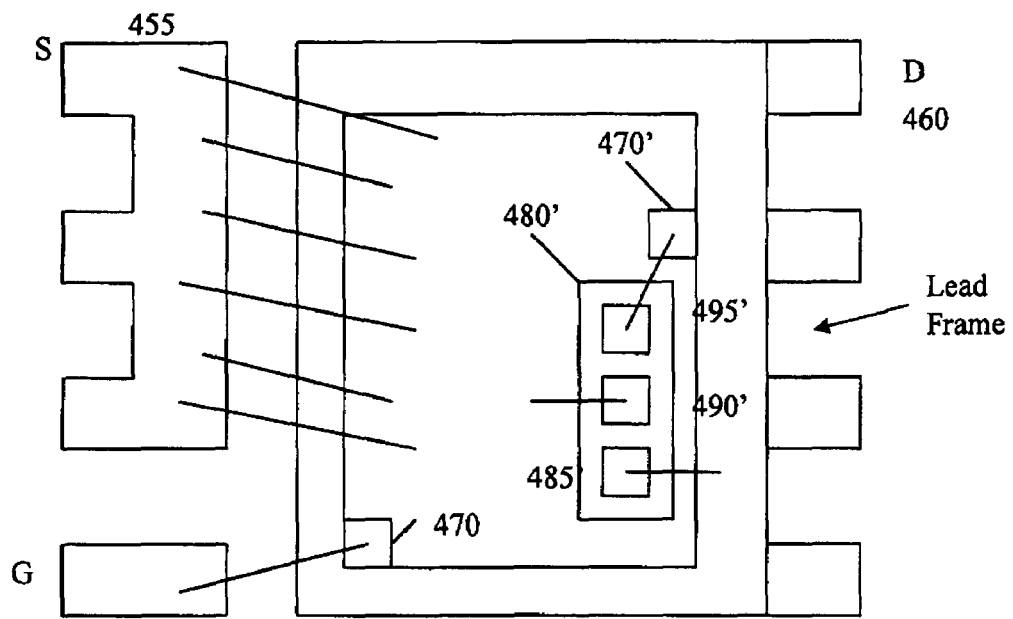
FIG. 11 shows a chip on chip implementation of a power MOSFET with a shunt FET.

FIG. 11 shows another embodiment of a two-die package with smaller package size where the shunt FET 480' is mounted directly on the power FET 450'. Again, the terminals 485' (G'), 490 (S'), and 495' (D') of the shunt FET 480' are bond-wired to the power FET 450'. In this case, the power FET is again shown with a second gate pad 470' to connect to the drain 495' of the shunt FET 480' to the gate of the power FET 470'.

Figure 12:
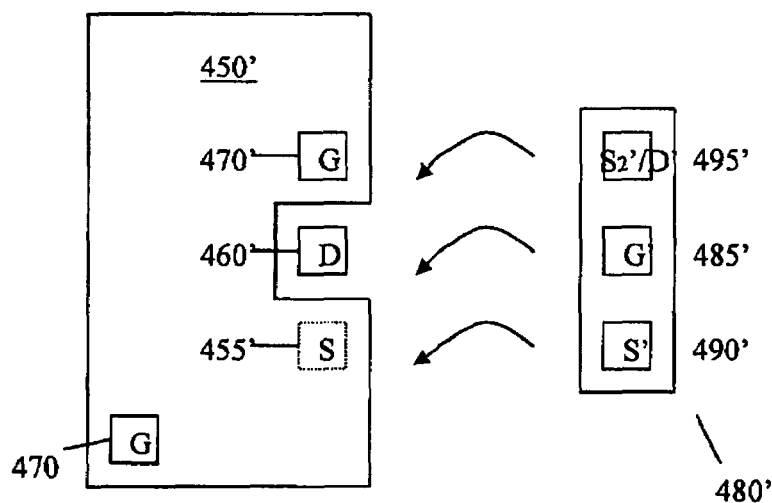
FIGS. 12A, 12B and 12C show a low inductance chip on chip configuration for implementing a power MOSFET with a shunt FET of this invention.
Figure 12B:
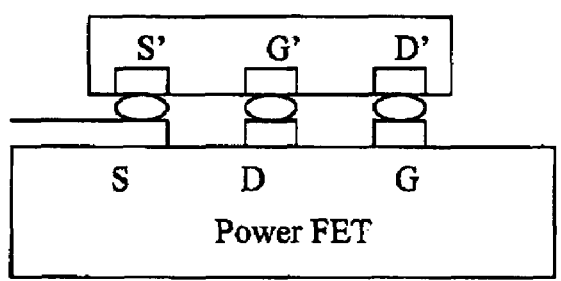
Figure 12C:
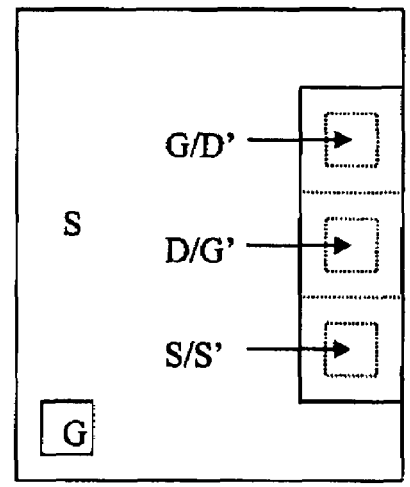

FIG. 12A shows a preferred embodiment to simplify the process of manufacturing, where the shunt FET 480' is flipped and attached to the power FET 450' without the use of any bond-wires. The termination area of the power FET is notched in to create source 455', drain pad 460' and gate pad 470' for flip attaching the gate 485' of the shunt FET to the drain pad 460'. The other two terminals, i.e., the shunt FET source 495' is connect to the gate pad 470' and the source 490' is connected to an adjacent source pad 455'. FIGS. 12B and 12C show the side cross sectional view and top view respectively of the flip attachment device as that shown in FIG. 12A. The shunt FET may be a common-drain or other configuration device where all three terminals are on the top surface. Many attachment techniques may be used—including but not limited to—solder attach, silver epoxy attach, eutectic attach using Au wire bumps.

In theory, the shunt FET 480's should be located as close as possible to the power FET 450' to minimize any inductance in the path of Crss*dV/dt current flow. Also, since the power FET has a distributed gate resistance, it is best to place the shunt FET such that as much of this gate resistance is bypassed as possible. This is achieved by placing the shunt FET as close as possible to the center of the device, furthest away from the gate fingers and gate bus. If this gets in the way of efficient source wiring for the power FET, the next best location in the center of the right edge as shown in FIGS. 12A and 12C. This allows the shunt FET to have maximum effect.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A metal oxide semiconductor field effect transistor (MOSFET) device comprising:
    a shunt FET connected between a gate and a source of said MOSFET device wherein said shunt FET is provided to shunt a transient gate-to-drain current of said MOSFET device while maintaining a low voltage across said FET whereby preventing said MOSFET device from turning on;
    said shunt FET is integrated with said MOSFET device as a single integrated circuit (IC) supported on a same substrate; and
    said shunt FET is disposed in a layer of re-crystallized silicon formed on a top surface of said substrate and separated from said substrate by an insulation layer with said drain of said MOSFET device under said insulation layer functioning as a gate of said shunt FET.

2. A buck converter comprising:
    a high-side MOSFET device having a first high-side source connected to a low-side drain of a low-side MOSFET device;
    a shunt FET connected between a low-side gate and said low-side source of said low-side MOSFET device wherein said shunt FET is provided to shunt a transient gate-to-drain current of said low-side MOSFET device while maintaining a low voltage across said FET whereby preventing said low-side MOSFET device from turning on;
    said shunt FET is integrated with said MOSFET device as a single integrated circuit (IC) supported on a same substrate; and
    said shunt FET is disposed in a layer of re-crystallized silicon formed on a top surface of said substrate and separated from said substrate by an insulation layer with said drain of said MOSFET device under said insulation layer functioning as a gate of said shunt FET.

3. A method for shunting a transient current of a metal oxide semiconductor field effect transistor (MOSFET) device comprising:
    connecting a shunt FET between a gate and a source of said MOSFET device to shunt a transient gate-to-drain current of said MOSFET device while maintaining a low voltage across said FET whereby preventing said MOSFET device from turning on;
    integrating said shunt FET with said MOSFET device as a single integrated circuit (IC) supported on a same substrate; and
    disposing said shunt FET in a layer of re-crystallized silicon formed on a top surface of said substrate and separated from said substrate by an insulation layer with said drain of said MOSFET device under said insulation layer functioning as a gate of said shunt FET.

* * * * *